(12) United States Patent
Wu et al.

(10) Patent No.: US 12,423,044 B1
(45) Date of Patent: Sep. 23, 2025

(54) INTELLIGENT DUAL-SCREEN DISPLAYED CALENDAR

(71) Applicant: Shenzhen Xinzhengyu Technology Co., Ltd., Shenzhen (CN)

(72) Inventors: Junhua Wu, Shenzhen (CN); Lingzhong Zhao, Shenzhen (CN)

(73) Assignee: Shenzhen Xinzhengyu Technology Co., Ltd., Shenzhen (CN)

( * ) Notice: Subject to any disclaimer, the term of this patent is extended or adjusted under 35 U.S.C. 154(b) by 0 days.

(21) Appl. No.: 19/221,377

(22) Filed: May 28, 2025

(30) Foreign Application Priority Data

Apr. 16, 2025 (CN) .......................... 202520721618.0

(51) Int. Cl.
| | |
|---|---|
| *G06F 3/14* | (2006.01) |
| *G06F 3/02* | (2006.01) |
| *G06F 3/16* | (2006.01) |
| *H04N 23/57* | (2023.01) |
| *H04R 1/02* | (2006.01) |
| *H05K 5/02* | (2006.01) |

(52) U.S. Cl.
CPC .............. *G06F 3/1423* (2013.01); *G06F 3/02* (2013.01); *G06F 3/165* (2013.01); *H04N 23/57* (2023.01); *H04R 1/028* (2013.01); *H05K 5/0217* (2013.01); *H04R 2499/15* (2013.01)

(58) Field of Classification Search
CPC .......... G06F 3/1423; G06F 3/02; G06F 3/165; H04N 23/57; H04R 1/028; H04R 2499/15; H05K 5/0217
See application file for complete search history.

(56) References Cited

U.S. PATENT DOCUMENTS

| | | | | |
|---|---|---|---|---|
| 8,070,117 | B2 * | 12/2011 | Burge | G06F 1/1605 |
| | | | | 248/222.52 |
| 9,721,529 | B2 * | 8/2017 | Ackley | G06F 3/1438 |
| 10,175,726 | B2 * | 1/2019 | Lee | G06F 1/1641 |
| 10,884,690 | B2 * | 1/2021 | Komiyama | G06F 1/1649 |
| 12,099,774 | B2 * | 9/2024 | Kumar | G06F 3/0484 |
| 2003/0222149 | A1 * | 12/2003 | Solomon | G06F 1/166 |
| | | | | 235/472.01 |

(Continued)

FOREIGN PATENT DOCUMENTS

| | | |
|---|---|---|
| CN | 207182789 U | 4/2018 |
| CN | 117611121 A | 2/2024 |
| CN | 220796127 U | 4/2024 |

*Primary Examiner* — Vinh T Lam
(74) *Attorney, Agent, or Firm* — Nitin Kaushik

(57) ABSTRACT

Disclosed is an intelligent dual-screen displayed calendar including a housing having a display provided therein, where the display is divided into a plurality of display areas; the plurality of display areas can respectively display schedule, reminders and digital photograph information, and display date and time, weather, positioning information and GPT voice chat; and a rear end face of the housing is provided with two detachable brackets which may be provided at either a first end or a second end of the housing, so that the housing may be placed on a carrier in either the transverse or longitudinal direction. A physical screen is divided into plurality of display areas, and a multi-screen function is achieved by virtual segmentation technology, which avoids adding additional hardware cost. The plurality of display areas can display the core information such as schedule and reminders.

10 Claims, 6 Drawing Sheets

(56) References Cited

U.S. PATENT DOCUMENTS

| | | | | |
|---|---|---|---|---|
| 2014/0347814 A1* | 11/2014 | Zaloom | ............ | G06F 1/16 |
| | | | | 248/688 |
| 2017/0337025 A1* | 11/2017 | Finnan | ............ | H04M 1/0266 |
| 2019/0155571 A1* | 5/2019 | Rhee | ............ | G10L 15/30 |
| 2021/0240233 A1* | 8/2021 | Steinbeisser | ............ | H05K 5/0217 |
| 2022/0253139 A1* | 8/2022 | Berliner | ............ | G06F 1/1686 |
| 2022/0253201 A1* | 8/2022 | Berliner | ............ | G06F 3/012 |
| 2022/0256062 A1* | 8/2022 | Berliner | ............ | G06F 1/1686 |
| 2022/0261091 A1* | 8/2022 | Berliner | ............ | G06F 3/02 |
| 2023/0145049 A1* | 5/2023 | Dolev | ............ | G02B 27/0172 |
| | | | | 345/633 |
| 2023/0162461 A1* | 5/2023 | Knaani | ............ | H04S 7/304 |
| | | | | 345/419 |
| 2023/0315247 A1* | 10/2023 | Pastrana | ............ | G06F 1/1626 |
| | | | | 715/716 |
| 2024/0085978 A1* | 3/2024 | Dolev | ............ | G06F 3/03545 |
| 2024/0364962 A1* | 10/2024 | Hwang | ............ | G06F 3/165 |
| 2025/0217091 A1* | 7/2025 | Lee | ............ | G06F 3/1423 |

\* cited by examiner

INTELLIGENT DUAL-SCREEN DISPLAYED CALENDAR

CROSS-REFERENCE TO RELATED APPLICATIONS

The application claims priority to Chinese patent application No. 2025302065993, filed on Apr. 16, 2025, the entire contents of which are incorporated herein by reference.

TECHNICAL FIELD

The present application relates to the technical field of intelligent calendars, and in particular, to an intelligent dual-screen displayed calendar.

BACKGROUND

With the popularity of intelligent devices, intelligent electronic calendar has gradually become an important tool for information management in the home and office scenarios.

However, the intelligent electronic calendars in the prior art are mostly of a single screen design, resulting in a limited display information capacity, and a user needs to frequently switch interfaces to view different contents, such as a schedule, weather, time, etc. which is inefficient in operation.

In addition, the traditional devices have shortcomings in privacy protection (such as camera exposure risk) and interaction mode (relying on single touch control or key operation), and it is difficult to meet the user's needs for multifunctional integration, convenient operation and privacy security; for example, a single screen cannot display both the core calendar and ancillary information, while a stationary camera lacks a physical obscuration design and is at a risk of privacy leaks.

SUMMARY

The present application is intended to solve at least one of the technical problems in the related art to some extent. To this end, it is an objective of the present application to provide an intelligent dual-screen displayed calendar including:

a housing having a display provided therein; where
the display is divided into a plurality of display areas;
the plurality of display areas can respectively display schedule, reminders and digital photograph information, and display date and time, weather, positioning information and GPT voice chat; and
a rear end face of the housing is provided with two detachable brackets which may be provided at either a first end or a second end of the housing, so that the housing may be placed on a carrier in either the transverse or longitudinal direction.

Preferably, a rear end face of the housing is provided with a fixed frame, a first end of the fixed frame is provided with two first mounting grooves which are spaced apart, a second end of the fixed frame is provided with two second mounting grooves which are spaced apart, and two of the brackets can be embedded in the two first mounting grooves or the two second mounting grooves.

Preferably, a first positioning column is provided within the first mounting groove and a second positioning column is provided within the second mounting groove.

Preferably, the bracket is provided with a plurality of positioning holes, the positioning holes corresponding to the first positioning column and the second positioning column.

Preferably, a fixed support is provided in the housing, and two projections which are spaced apart are provided at the top of the fixed support.

Preferably, a camera is provided at an end of the fixed support, and the camera is spaced apart from an upper end of the main display area.

Preferably, a baffle is further provided on the fixed support, the baffle is provided in a shape of "7", a first end of the baffle is slidably provided on the fixed support, a second end of the baffle is provided at a front end of the camera, a sliding button is further provided on the top of the baffle, and the sliding button extends through the top of the housing.

Preferably, two sliding grooves spaced apart are provided at the bottom of the baffle, the ends of the sliding grooves are provided with grooves corresponding to the projections, and the projections are slidingly arranged in the sliding grooves.

Preferably, a main control module and a microphone are provided at the top of the housing, and the main control module is composed of an on-off key and a volume key.

Preferably, the bracket is provided in an inverted "V" shape, and soft rubber pads are respectively provided at the bottoms of two ends of the bracket.

The above-described aspect of the present application includes at least the following advantageous effects:

by dividing a single physical screen into a plurality of display areas, a multi-screen function can be achieved through a virtual segmentation technology to avoid adding additional hardware costs, and a plurality of display areas can respectively display core information such as a schedule and a reminder, and display auxiliary contents such as time and weather in real time, and multi-dimensional information can be acquired synchronously without switching interfaces, thereby significantly improving user operation efficiency; the detachable bracket design allows the user to freely adjust the screen angle, adapt to different use scenarios, and the user can mount the bracket on the first end or the second end of the housing according to his/her own needs, so that the display is placed in the transverse or longitudinal direction.

Additional aspects and advantages of the present application will be set forth in part in the description which follows and, in part, will be obvious from the description, or may be learned by practice of the present application.

BRIEF DESCRIPTION OF DRAWINGS

In order to explain the embodiments of the present application or the technical solutions in the prior art more clearly, a brief description will be given below with reference to the accompanying drawings which are used in the description of the embodiments or the prior art, and it is obvious that the drawings in the description below are merely some embodiments of the present application, and it would have been obvious for a person skilled in the art to obtain other drawings according to the structures illustrated by these drawings without involving any inventive effort.

Figure 1:
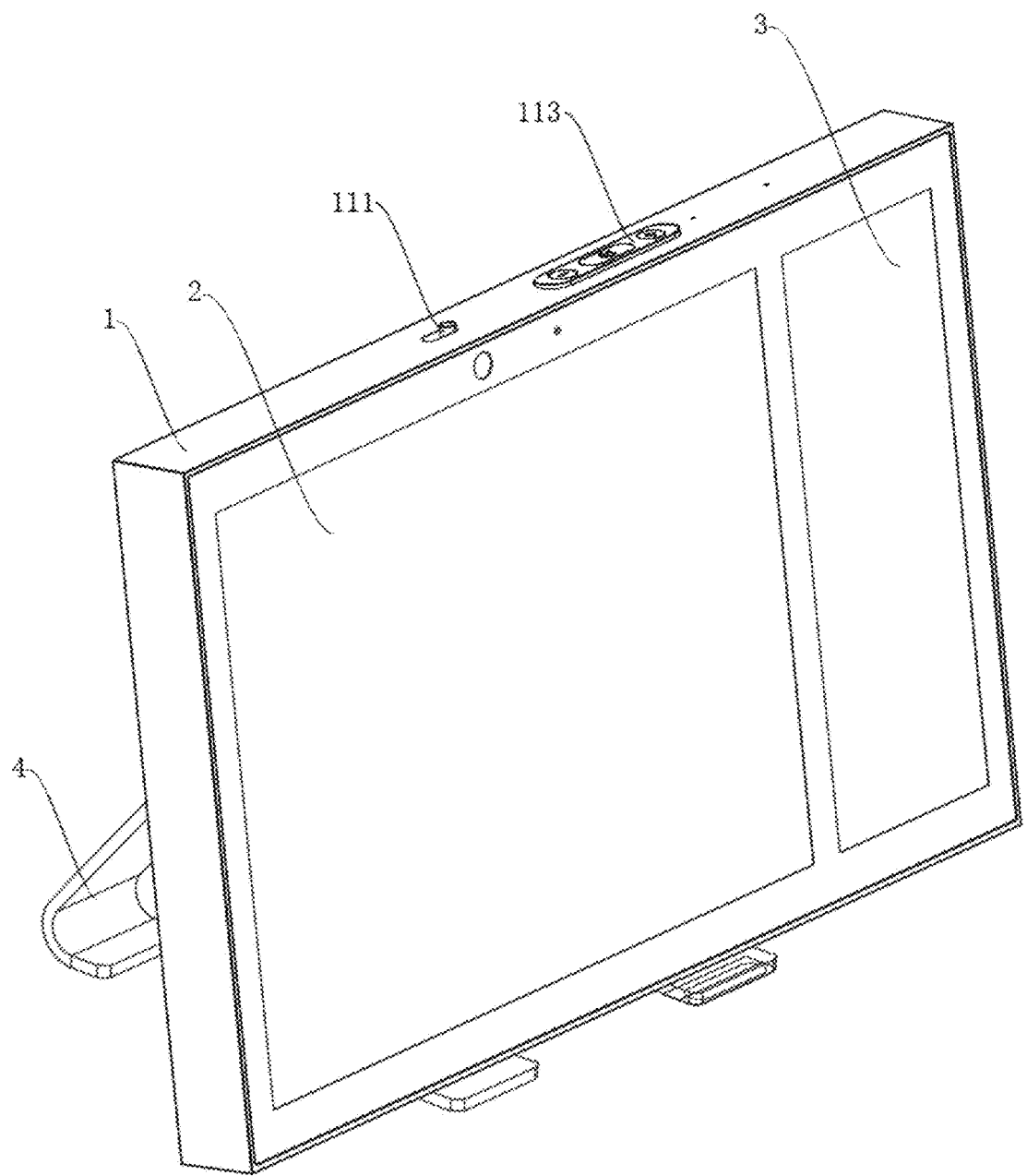
FIG. 1 is a schematic structural diagram showing an intelligent dual-screen displayed calendar according to an embodiment of the present application.

DESCRIPTION OF REFERENCE NUMERALS 1. housing, 2. main display area, 3. sub-display area, 4. bracket; 101. fixed frame, 102. first mounting groove, 103. second mounting groove, 104. first positioning column, 105. second positioning column, 106. fixed support, 107. sliding groove, 108. projection, 109. camera, 110. baffle, 111. sliding button, 112. groove, 113. main control module;

401. positioning hole, 402. soft rubber pad.

The objectives, features and advantages of the present application will be further described with reference to the accompanying drawings in conjunction with the embodiments.

DETAILED DESCRIPTION OF THE EMBODIMENTS

Reference will now be made in detail to the embodiments of the present application, examples of which are illustrated in the accompanying drawings, where like reference numerals refer to the same or similar elements throughout the several views, and where like reference numerals refer to the same or similar elements throughout the several views. The embodiments described below with reference to the drawings are exemplary and intended to be illustrative of the present application and are not to be construed as limiting the present application, and all other embodiments which can be obtained by a person skilled in the art without inventive effort on the basis of the embodiments of the present application fall within the scope of protection of the present application.

In the description of the present application, it is to be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "circumferential", "radial", and the like, indicate orientations or positional relationships based on those shown in the drawings, merely for convenience of description and simplification of the description, and do not indicate or imply that the device or element referred to must have a particular orientation, be constructed in a particular orientation, and be operated, and thus, are not to be construed as limiting the present application.

Further, the terms "first" and "second" are used for descriptive purposes only and are not to be construed as indicating or implying relative importance or implicitly indicating the number of technical features indicated. Thus, a feature defined as "first" or "second" may explicitly or implicitly include one or more of the stated features. In the description of the present application, "a plurality of" refers to two or more unless specifically defined otherwise.

In the present application, unless expressly specified or limited otherwise, the terms "mounted", "connected to", "connected", and "fixed" are to be interpreted broadly, e.g. either fixedly or detachably, or integrally; may be a mechanical connection or an electrical connection; it can be directly connected or indirectly connected through an intermediate medium, and can be the communication between two elements. The specific meaning of the above terms in the present application can be understood by a person skilled in the art according to specific circumstances.

In the present application, unless otherwise expressly specified and defined, a first feature being "above" or "below" a second feature may include direct contact between the first and second features, or may include indirect contact where the first and second features are not in direct contact but are contacted through additional features therebetween. Moreover, the terms "above", "over", and "on" the second feature include cases where the first feature is directly above or diagonally above the second feature, or merely indicate that the horizontal level of the first feature is higher than that of the second feature. Similarly, the terms "below", "under", and "beneath" the second feature include cases where the first feature is directly below or diagonally below the second feature, or merely indicate that the horizontal level of the first feature is lower than that of the second feature.

The embodiments of the intelligent dual-screen displayed calendar according to the present application will be described in detail below with reference to the accompanying drawings.

Figure 2:
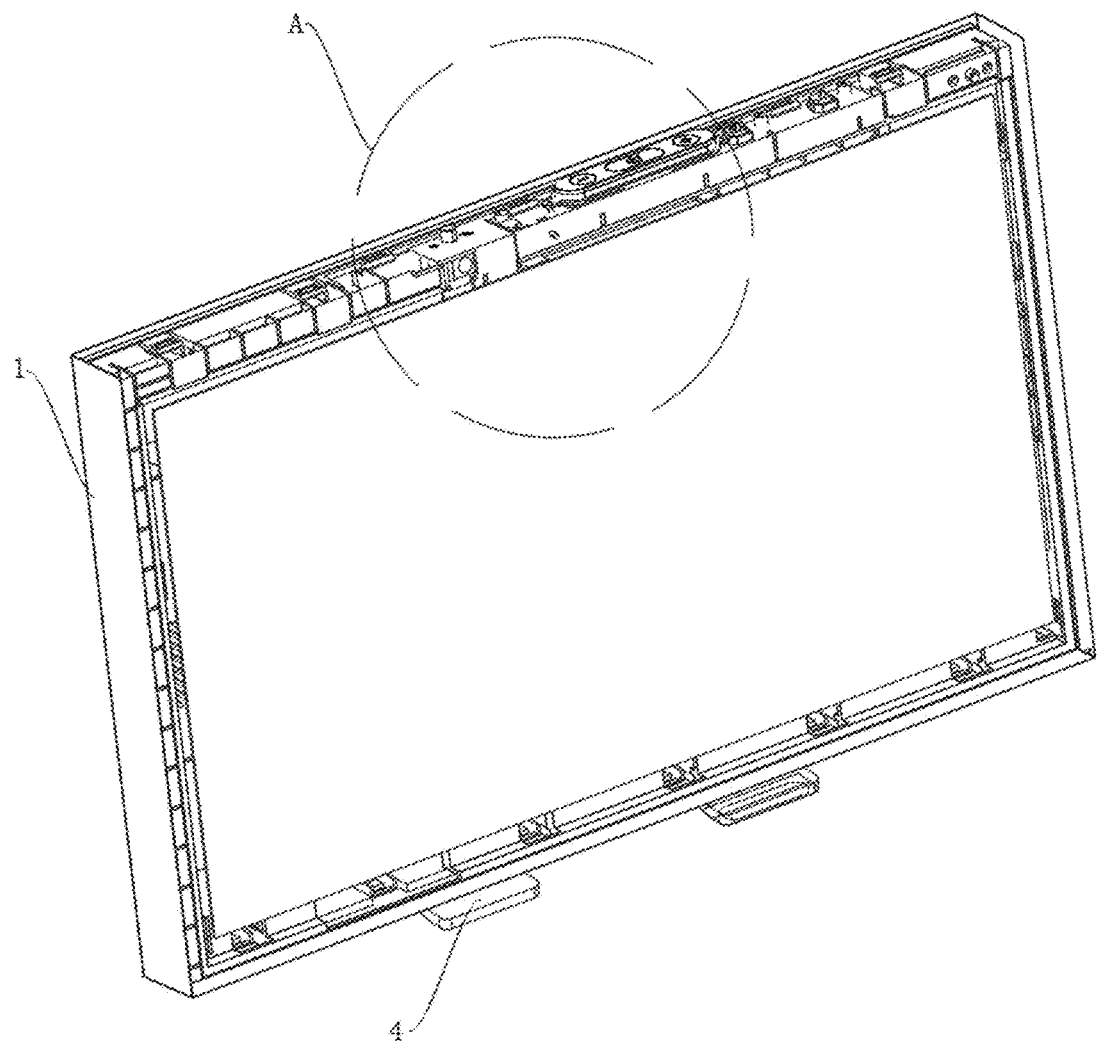
FIG. 2 is a schematic structural diagram showing a housing according to an embodiment of the present application.
Figure 3:
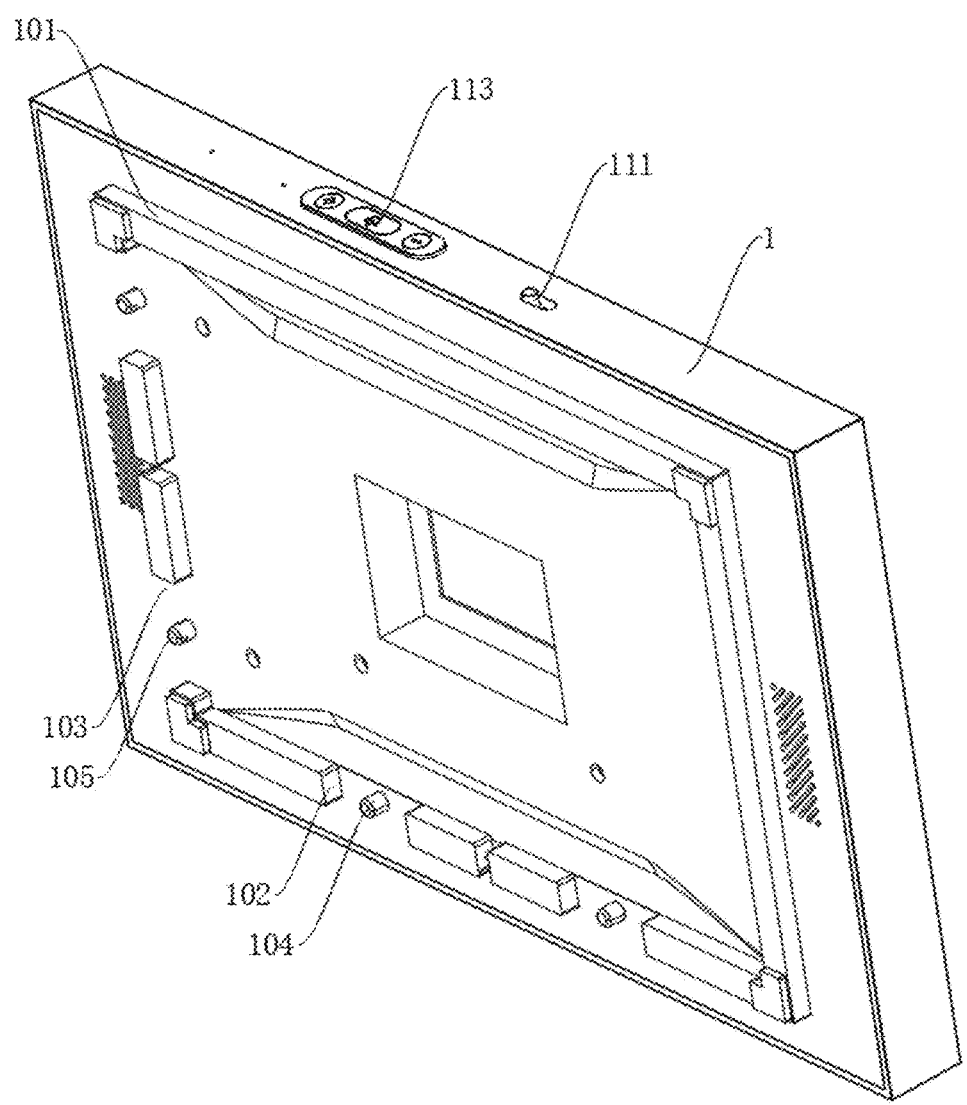
FIG. 3 is a schematic structural diagram showing a fixed frame according to an embodiment of the present application.
Figure 4:
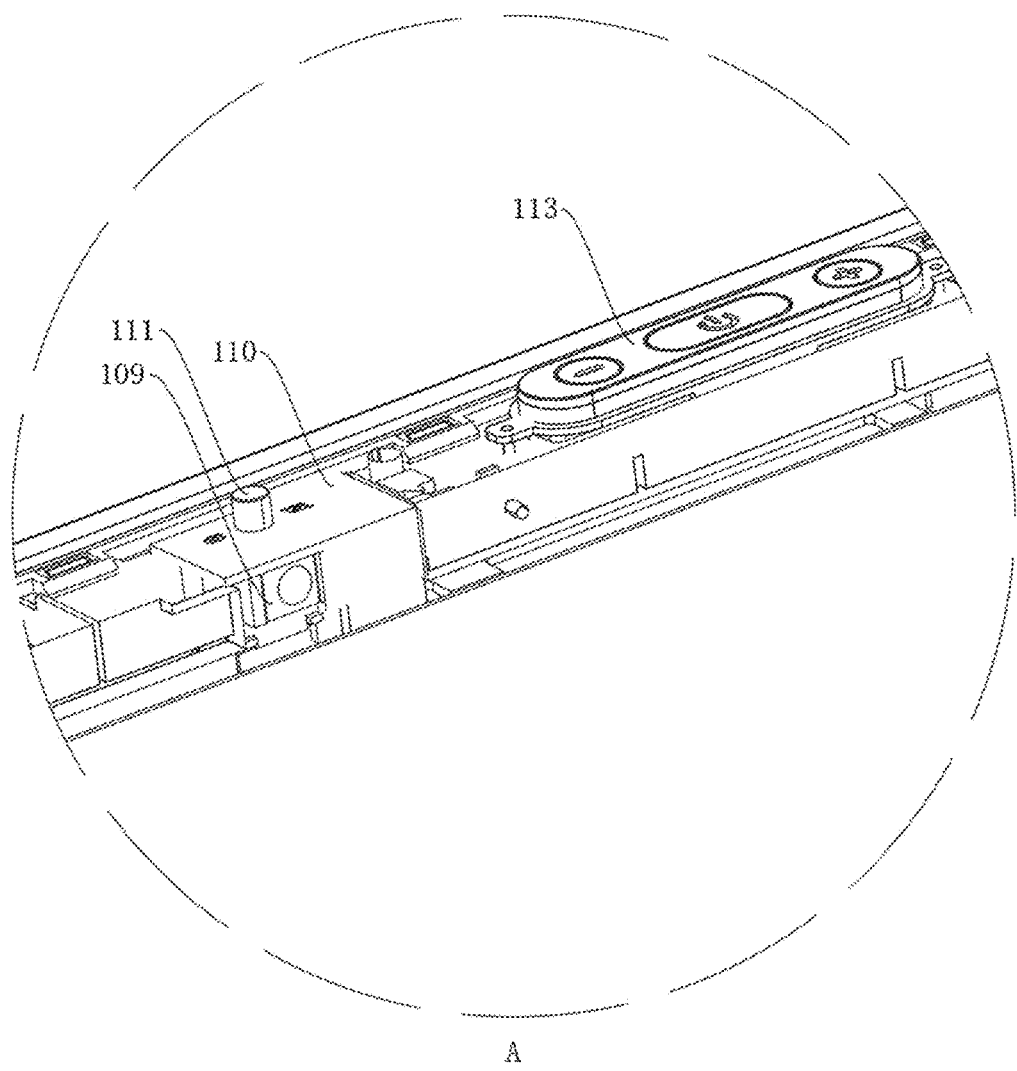
FIG. 4 is an enlarged view of a portion A of FIG. 2.
Figure 5:
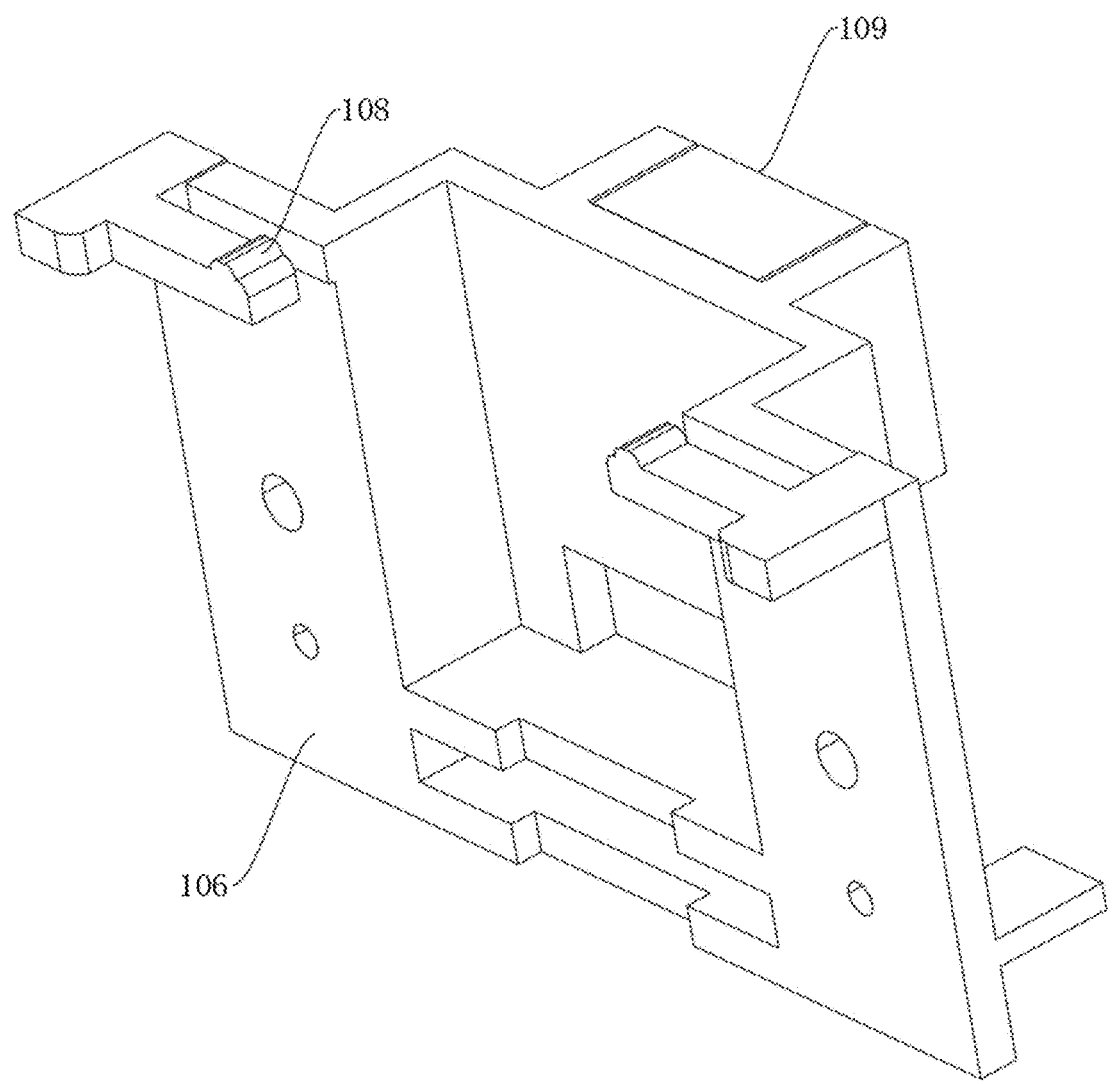
FIG. 5 is a schematic structural diagram showing a fixed support according to an embodiment of the present application.
Figure 6:
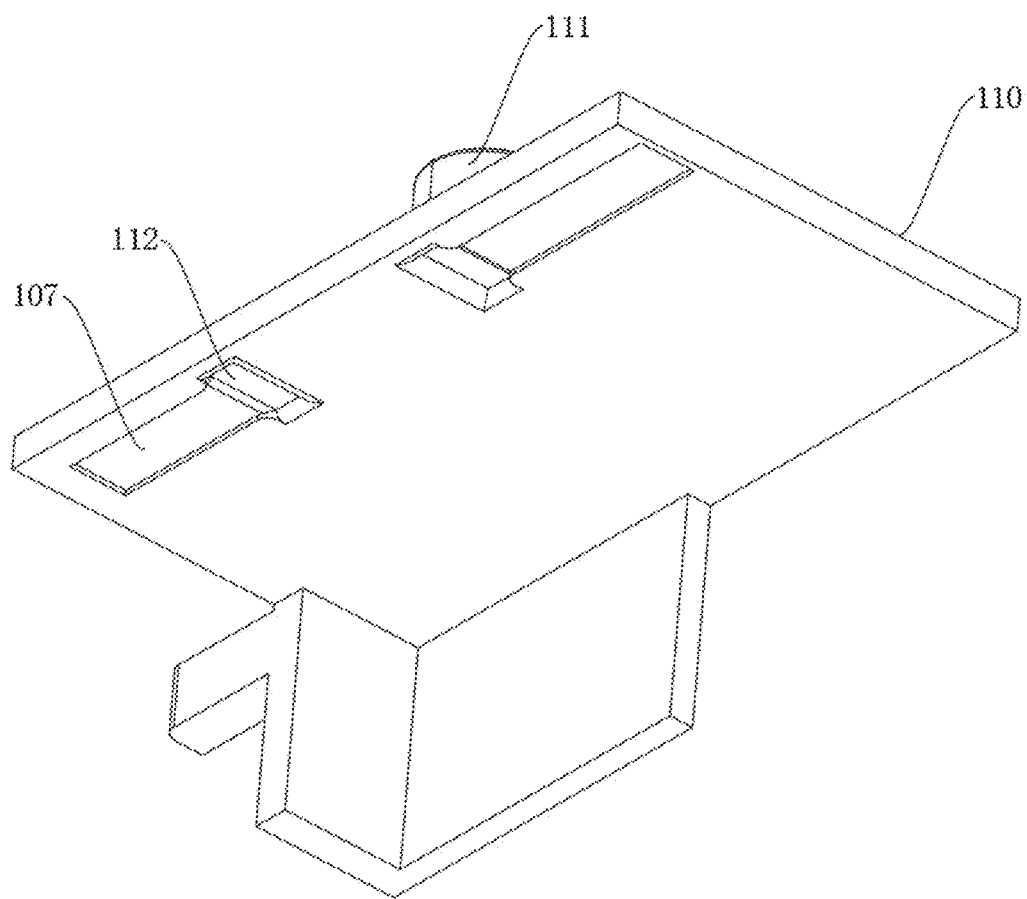
FIG. 6 is a schematic structural diagram showing a baffle according to an embodiment of the present application.

Referring to FIGS. 1 to 6, in the present embodiment, there is provided: a housing 1 having a display provided therein; where the display is divided into a plurality of display areas; the plurality of display areas can respectively display schedule, reminders and digital photograph information, and display date and time, weather, positioning information and GPT voice chat; and a rear end face of the housing 1 is provided with two detachable brackets 4 which may be provided at either a first end or a second end of the housing 1, so that the housing 1 may be placed on a carrier in either the transverse or longitudinal direction. A physical screen is divided into plurality of display areas, and a multi-screen function is achieved by virtual segmentation technology, which avoids adding additional hardware cost. The plurality of display areas can display the core information such as schedule and reminders, and display the auxiliary content such as time and weather in real-time. The multi-dimensional information can be acquired synchronously without switching the interface, which significantly improves the user's operation efficiency; the detachable bracket 4 design allows the user to freely adjust the screen angle, adapt to different use scenarios, and the user can mount the bracket 4 on the first end or the second end of the housing 1 according to his/her own needs, so that the display is placed in the transverse or longitudinal direction.

The display is divided by a software layer into at least one main display area 2 for displaying schedule, reminders and digital photograph information and at least one sub-display area 3 for displaying date and time, weather, positioning information and GPT voice chat.

In the present embodiment, the rear end face of the housing 1 is provided with a fixed frame 101, a first end of the fixed frame 101 is provided with two first mounting grooves 102 which are spaced apart, a second end of the fixed frame 101 is provided with two second mounting grooves 103 which are spaced apart, and the two brackets 4 can be embedded in the two first mounting grooves 102 or the two second mounting grooves 103; gaskets are provided at the four corners of the fixed frame 101 so that when the housing 1 is laid flat on a carrier, the gaskets can cushion and rub against the carrier, thereby protecting the housing 1 from being easily worn and from sliding when laid flat.

In the present embodiment, a first positioning column 104 is provided in the first mounting groove 102, and a second positioning column 105 is provided in the second mounting groove 103; a plurality of positioning holes 401 are provided on the bracket 4, and the positioning holes 401 correspond to the first positioning column 104 and the second positioning column 105; a user can embed the two brackets 4 in the two first mounting grooves 102 or the two second mounting grooves 103 according to actual requirements, and when the brackets 4 are embedded in the first mounting grooves 102, the display can be transversely arranged; when the bracket 4 is embedded in the second mounting groove 103, the display can be placed in a longitudinal direction, and the requirements of the user can be satisfied by being mounted in different mounting grooves; furthermore, by means of the corresponding design of the positioning columns (the first positioning column 104 and the second positioning column 105) and the positioning holes 401 on the bracket 4, it is ensured that the bracket 4 can be quickly aligned and fixed when being embedded into the mounting groove, so as to avoid mounting offset or looseness, and improve the connection stability of the bracket 4 and the housing 1; the design of the plurality of positioning holes 401 allows the bracket 4 to flexibly adjust the embedding position in different mounting grooves (e.g., the first mounting groove 102 or the second mounting groove 103) to accommodate a variety of equipment placement requirements (e.g., transverse or longitudinal support), while simplifying the user's mounting process and eliminating the need for additional tools to accomplish the disassembly or adjustment.

In the present embodiment, the housing 1 is provided with a fixed support 106, and the top of the fixed support 106 is provided with two protruding blocks 108 which are spaced apart; the end of the fixed support 106 is provided with a camera 109, and the camera 109 is arranged at the upper end of the main display area 2 spaced apart; a baffle 110 is further provided on the fixed support 106, the baffle 110 is provided in a "7" shape, a first end of the baffle 110 is slidably provided on the fixed support 106, a second end of the baffle 110 is provided at the front end of the camera 109, and a sliding button 111 is further provided on the top of the baffle 110, and the sliding button 111 passes through the top of the housing 1; the bottom of the baffle 110 is provided with two sliding grooves 107 spaced apart, the end of the sliding groove 107 is provided with a groove 112 corresponding to the projection 108, and the projection 108 is slidingly arranged in the sliding groove 107; the slidable "7" shaped baffle 110 is arranged at the front of the camera 109, and a user controls the movement of the baffle 110 via a top sliding button 111, and when the camera 109 is blocked, a power shut-off function can be automatically triggered to avoid unauthorized access, and both the convenience of operation and privacy and security are taken into consideration; in addition, the mechanical engagement between the groove 112 and the projection 108 achieves the accurate positioning of the sliding end point of the baffle 110, so as to prevent the baffle 110 from accidentally moving due to gravity or mis-touch, and to ensure the reliability of the shielding state of the camera 109.

In the present embodiment, a main control module 113 and a microphone are provided on the top of the housing 1, and the main control module 113 is composed of an on-off key and a volume key; the main control module 113 (a switch key and a volume key) is centrally arranged on the top of the housing 1, and conforms to the user's one-hand operation habit, so as to facilitate fast switching devices or adjust the volume, reduce the probability of false touch and improve the interaction efficiency; the physical key design provides clear tactile feedback and enhances the intuitive operation, especially for the scene with insufficient light or blind operation; the microphone and the main control module 113 are cooperatively arranged at the top, away from the mechanical components such as the display and the bracket 4, so as to reduce the interference of the environmental noise (such as the friction sound of the bracket 4) on the voice input; in addition, it can support voice assistant function (such as voice command control schedule reminder, weather inquiry, etc.), expand the interaction mode, and meet the diversified needs of users to support voice assistant function.

In the present embodiment, the bracket 4 is arranged in an inverted "V" shape, and soft rubber pads 402 are respectively provided at the bottom of two ends of the bracket 4; the inverted "V"-shaped bracket 4 is designed to enhance the overall stability through the triangular mechanical structure, so as to ensure that the equipment is not easily toppled when placed on different bearing surfaces, especially for inclined or smooth surfaces; the soft rubber pad 402 at the bottom of the bracket 4 provides a high coefficient of friction, effectively preventing the device from sliding or displacement, and at the same time, preventing the hard bracket 4 from scratching the bearing surface; the soft rubber pad 402 at the bottom of the bracket 4 provides a high coefficient of friction, effectively preventing displacement of the housing 1 of the device, while at the same time avoiding scratching of the load bearing surface by the hard bracket 4.

In describing the description, reference to the description of the terms "an embodiment", "some embodiments", "an example", "particular examples", or "some examples", etc., means that a particular feature, structure, material, or characteristic described in connection with the embodiment or example is included in at least an embodiment or example of the present application. In this description, schematic representations of the above terms are not necessarily directed to the same embodiment or example. In addition, the particular features, structures, materials, or characteristics described may be combined in any one or more embodiments or examples in a suitable manner. Moreover, various embodiments or examples described in this description, as well as features of various embodiments or examples, may be integrated and combined by a person skilled in the art without departing from the scope of the present application.

The above description is merely a preferred embodiment of the present application and does not limit the patent scope of the present application. Any equivalent structural transformation made using the description and drawings of the present application, or directly/indirectly applied in other related technical fields, under the inventive concept of the present application, is included in the patent protection scope of the present application.

What is claimed is:

1. An intelligent dual-screen displayed calendar, comprising:
   a housing having a display provided therein; wherein
   the display is divided into a plurality of display areas;
   the plurality of display areas can respectively display schedule, reminders and digital photograph information, and display date and time, weather, positioning information and GPT voice chat; and
   a rear end face of the housing is provided with two detachable brackets which may be provided at either a first end or a second end of the housing, so that the housing may be placed on a carrier in either the transverse or longitudinal direction.

2. The intelligent dual-screen displayed calendar according to claim 1, wherein the display area comprises at least one main display area for displaying schedule, reminders and digital photograph information and at least one sub-display area for displaying time of day, weather, positioning information and GPT voice chat.

3. The intelligent dual-screen displayed calendar according to claim 1, wherein a rear end face of the housing is provided with a fixed frame, a first end of the fixed frame is provided with two first mounting grooves which are spaced apart, a second end of the fixed frame is provided with two second mounting grooves which are spaced apart, and two of the brackets can be embedded in the two first mounting grooves or the two second mounting grooves.

4. The intelligent dual-screen displayed calendar according to claim 3, wherein a first positioning column is provided within the first mounting groove and a second positioning column is provided within the second mounting groove.

5. The intelligent dual-screen displayed calendar according to claim 4, wherein the bracket is provided with a plurality of positioning holes, the positioning holes corresponding to the first positioning column and the second positioning column.

6. The intelligent dual-screen displayed calendar according to claim 1, wherein a fixed support is provided in the housing, and two projections which are spaced apart are provided at the top of the fixed support.

7. The intelligent dual-screen displayed calendar according to claim 6, wherein a camera is provided at an end of the fixed support, and the camera is spaced apart from an upper end of the main display area.

8. The intelligent dual-screen displayed calendar according to claim 7, wherein a baffle is further provided on the fixed support, the baffle is provided in a shape of "7", a first end of the baffle is slidably provided on the fixed support, a second end of the baffle is provided at a front end of the camera, a sliding button is further provided on the top of the baffle, and the sliding button extends through the top of the housing.

9. The intelligent dual-screen displayed calendar according to claim 8, wherein two sliding grooves spaced apart are provided at the bottom of the baffle, the ends of the sliding grooves are provided with grooves corresponding to the projections, and the projections are slidingly arranged in the sliding grooves.

10. The intelligent dual-screen displayed calendar according to claim 1, wherein a main control module and a microphone are provided at the top of the housing, and the main control module is composed of an on-off key and a volume key.

* * * * *